US012572833B2

(12) United States Patent
Morello et al.

(10) Patent No.: US 12,572,833 B2
(45) Date of Patent: Mar. 10, 2026

(54) NUCLEAR SPIN QUANTUM PROCESSING ELEMENT AND METHOD OF OPERATION THEREOF

(71) Applicant: Silicon Quantum Computing Pty Limited, Kensington (AU)

(72) Inventors: Andrea Morello, Kensington (AU);
Serwan Asaad, Kensington (AU);
Vincent Mourik, Kensington (AU)

(73) Assignee: Silicon Quantum Computing Pty Limited, Kensington (AU)

( * ) Notice: Subject to any disclaimer, the term of this patent is extended or adjusted under 35 U.S.C. 154(b) by 1228 days.

(21) Appl. No.: 16/975,669

(22) PCT Filed: Mar. 1, 2019

(86) PCT No.: PCT/AU2019/000029
§ 371 (c)(1),
(2) Date: Aug. 25, 2020

(87) PCT Pub. No.: WO2019/165494
PCT Pub. Date: Sep. 6, 2019

(65) Prior Publication Data
US 2020/0410383 A1      Dec. 31, 2020

(30) Foreign Application Priority Data
Mar. 1, 2018    (AU) ................................ 2018900665

(51) Int. Cl.
*G06N 10/40*        (2022.01)
*B82Y 10/00*        (2011.01)
(Continued)

(52) U.S. Cl.
CPC ............. *G06N 10/40* (2022.01); *H10N 60/11* (2023.02); *B82Y 10/00* (2013.01); *B82Y 25/00* (2013.01)

(58) Field of Classification Search
CPC ........... H01L 29/7613; H01L 29/66984; H01L 29/82; H10N 60/11; H10N 99/05
See application file for complete search history.

(56) References Cited

U.S. PATENT DOCUMENTS

2016/0335559 A1     11/2016   Pereverzev
2018/0107938 A1 *    4/2018   Morello .............. H10N 60/805
2019/0236476 A1 *    8/2019   Pereverzev ............. C30B 29/02

FOREIGN PATENT DOCUMENTS

WO        1997047992 A1    12/1997
WO        2004106961 A1    12/2004
WO        WO-2016187676 A1 *  12/2016   ............. B82Y 10/00

OTHER PUBLICATIONS

Mourik, V. et al., An experimentally realizable single-atom chaotic driven top in silicon, arXiv: 1703.04852v1 [quant-ph] Mar. 15, 2017. (Year: 2017).*

(Continued)

*Primary Examiner* — Raj R Gupta
(74) *Attorney, Agent, or Firm* — Polsinelli PC

(57)        ABSTRACT
The present disclosure is directed a quantum processing element comprising: a semiconductor and a dielectric material forming an interface with the semiconductor; a dopant atom with nuclear spin of quantum number larger than ½ embedded in the semiconductor at a distance from the interface, at least one conductive electrode disposed in a manner such that there is at least a portion of dielectric material between the at least one conductive electrode and the dopant atom. The disclosure is also directed to a method of operating the quantum processing element comprising the steps of: applying a magnetic field to the dopant atom to separate the energies of the spin states associated with the nucleus of the dopant atom; applying a voltage to the at least one conductive electrode to generate an electric field gradient at a nucleus of the dopant atom; and encoding quantum (Continued)

information in the nuclear spin of the nucleus via the applied voltage.

20 Claims, 12 Drawing Sheets

(51) Int. Cl.
   *B82Y 25/00*          (2011.01)
   *H10N 60/10*         (2023.01)

(56)                    References Cited

OTHER PUBLICATIONS

Bechtold et al. "Three-stage decoherence dynamics of an electron spin qubit in an optically active quantum dot." Nature Phys 11, 1005-1008 (2015).*

International Search Report and Written Opinion; PCT Application No. PCT/AU2019/000029; mailed Jun. 18, 2019.

Bechtold A. et al., "Three stage decoherence dynamics of electron spin qubits in an optically active quantum dot", arXiv:1410.4316v2 [cond-mat.mes-hall] Apr. 30, 2015.

Munsch M. et al., "Manipulation of the nuclear spin ensemble in a quantum dot with chirped magnetic resonance pulses", Nature Nanotechnology vol. 9, pp. 671-675 (2014).

* cited by examiner

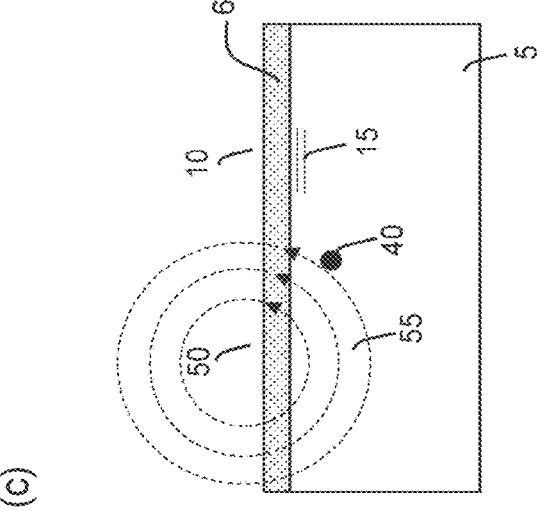
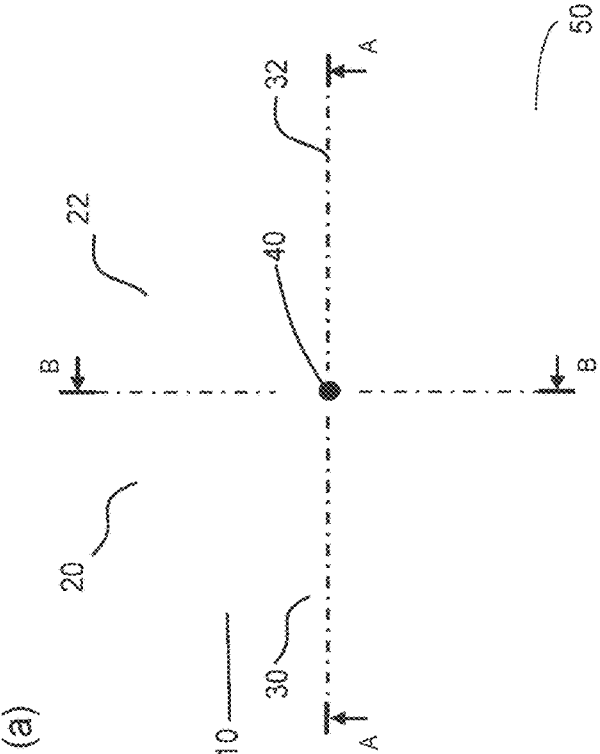
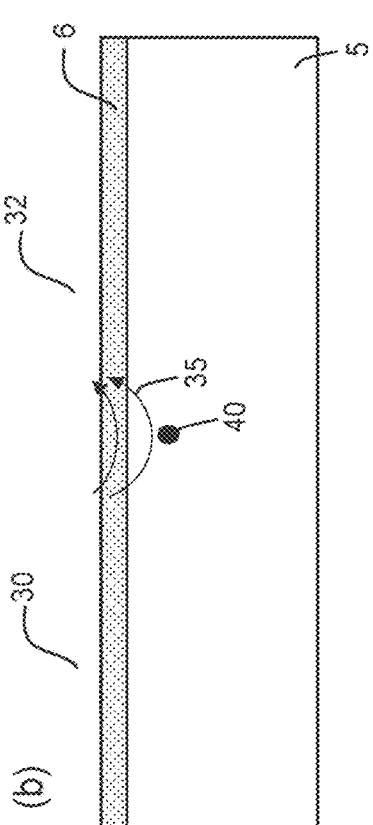
FIGURE 1

(a)
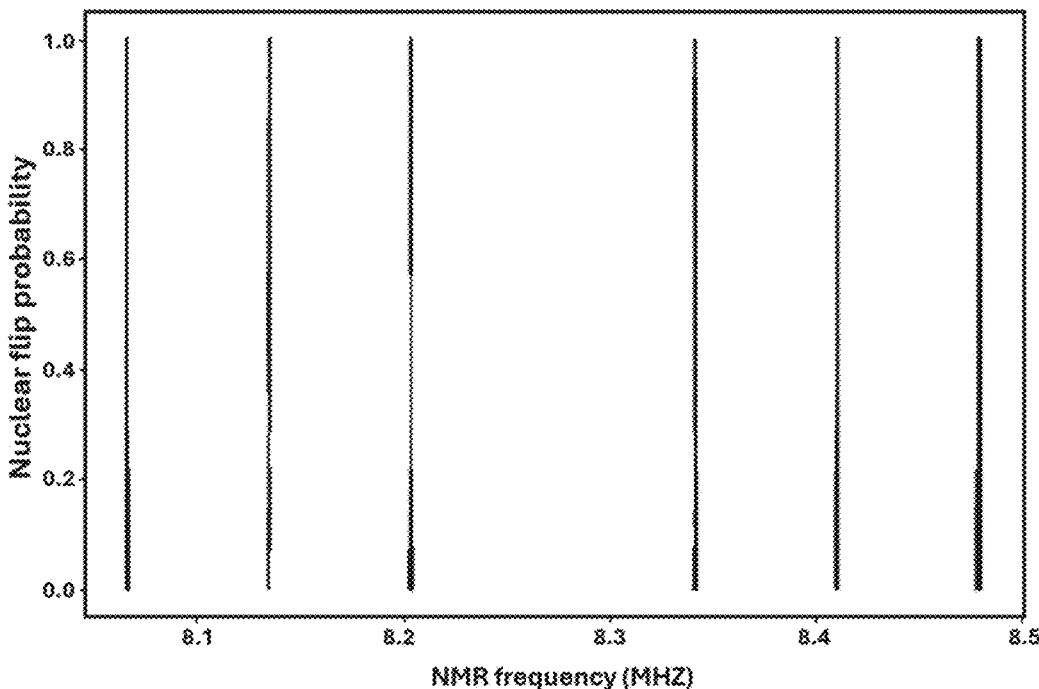
(b)
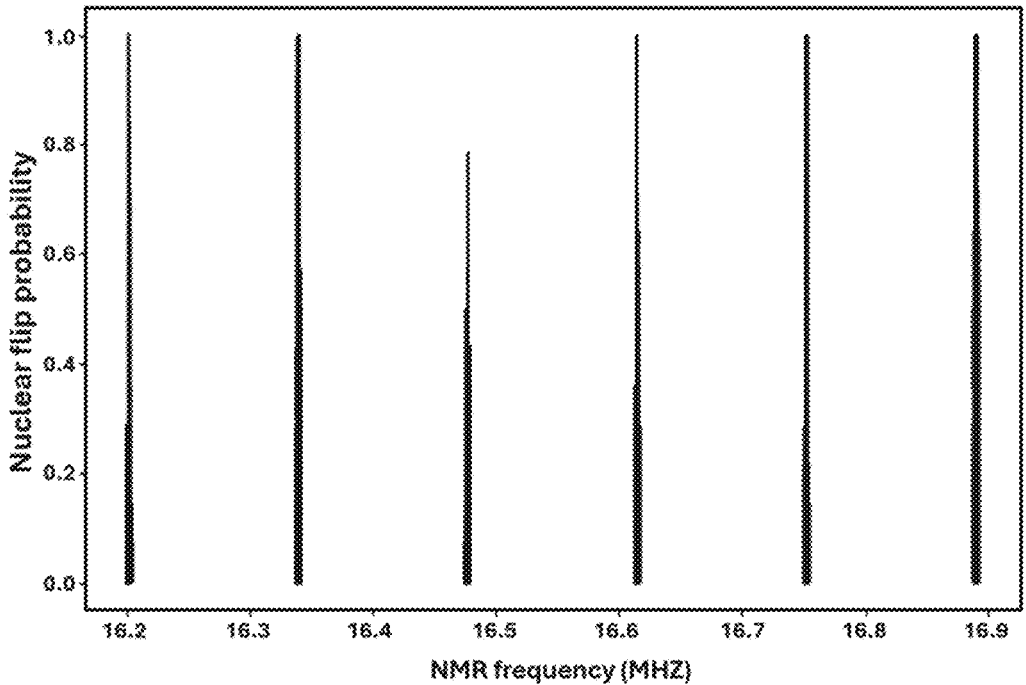
FIGURE 8

80

┌─────────────────────────────────────────┐
│ 82 - Applying a magnetic field to the dopant │
│ atom to separate the energies of the spin states │
│ associated with the nucleus of the dopant atom │
└─────────────────────────────────────────┘

┌─────────────────────────────────────────┐
│ 84 - Applying a voltage to the at least one │
│ conductive electrode to generate an electric │
│ field gradient at a nucleus of the dopant atom │
└─────────────────────────────────────────┘

┌─────────────────────────────────────────┐
│ 86 - Encoding quantum information in the │
│ nuclear spin of the nucleus via the applied │
│ voltage │
└─────────────────────────────────────────┘

92 - Applying a static magnetic field to the dopant atom to separate the energies of the spin states associated with the nucleus of the dopant atom 94 - Measuring nuclear spin transition frequencies of the dopant atom 96 - Encoding quantum information in the nuclear spin of the nucleus via the applied voltage

NUCLEAR SPIN QUANTUM PROCESSING ELEMENT AND METHOD OF OPERATION THEREOF

CROSS-REFERENCE TO RELATED APPLICATIONS

This application is a national stage entry of PCT/AU2019/000029 filed Mar. 1, 2019, which claims priority to Australian Patent Application No. 2018900665 filed Mar. 1, 2018, said application is expressly incorporated herein in its entirety.

TECHNICAL FIELD

The present invention relates to a method of operation of a quantum processing element consisting of a nuclear spin, and an advanced processing apparatus comprising a plurality of quantum processing elements operated in accordance with the method.

BACKGROUND

Quantum computing is an emerging technology field, which is undergoing a transition from basic research to practical and commercial applications. The majority of prototype quantum computers encode information in the discrete quantum states of two-level systems, called qubits. Leading examples of qubits are superconducting circuits such as "transmons", electron spins confined in semiconductor nanostructures, or ionized atoms held in electromagnetic traps in vacuum. Each type of qubit has advantages and disadvantages.

For instance, transmons offer fast and high-fidelity operations, and they can be controlled using very weak oscillating electric fields, down to the value corresponding to a single quantum of electromagnetic field (a photon) in a microwave resonator. However, they have a large size that can become problematic when attempting to integrate hundreds or thousands of qubits on a single chip.

Electron spins in semiconductors have the benefit of long coherence times, and potential compatibility of fabrication with the existing semiconductor industry. Their weakness is that the typical way for electron spins to interact is via exchange coupling, which is a very short-range interaction that poses challenges for integrating control lines in the very tight spacing between the qubits.

Ions trapped in vacuum offer exceptionally long coherence times and high gate fidelities, but the manufacturability of trapping systems with large numbers of ions remains unclear, and the need for many lasers to traps and control the ions is also problematic when scaling up the system.

The devices disclosed herein can also be used for strain sensing of cryogenic electronic devices. In several solid state quantum computing applications, crystal lattice strain affects the control and operation of the quantum processing elements and it is important to be able to quantify lattice strain at different locations across the device. Measuring strain at cryogenic temperatures can provide an indication of strain at room temperature. Therefore, the devices disclosed herein may also have application in the broader integrated circuit industry.

SUMMARY

Quantum information does not have to be encoded necessarily in two-level systems (qubits). It has also been suggested that it can be encoded in d-level systems, with d>2. Such systems are called qudits.

Embodiments of the invention propose a method to encode and manipulate nuclear spin qudits. The manipulation of the nuclear spin quantum state occurs purely via electric fields. This makes the invention prominently suitable for integration with conventional electronic devices.

In accordance with a first aspect, the present invention provides a method of operating a quantum processing element comprising:

a semiconductor and a dielectric material forming an interface with the semiconductor;

a dopant atom with nuclear spin of quantum number larger than ½ embedded in the semiconductor at a distance from the interface, at least one conductive electrode disposed in a manner such that there is at least a portion of dielectric material between the at least one conductive electrode and the dopant atom;

the method comprising the steps of:

applying a magnetic field to the dopant atom to separate the energies of the spin states associated with the nucleus of the dopant atom;

applying a voltage to the at least one conductive electrode to generate an electric field gradient at a nucleus of the dopant atom; and encoding quantum information in the nuclear spin of the nucleus via the applied voltage.

In an embodiment, the step of encoding of the quantum information in the nuclear spin of the nucleus is mediated by the quadrupole interaction.

In an embodiment, the method further comprises the step of controlling the voltage applied to the at least one conductive electrode to encode more than one qubit in the nuclear spin of the nucleus.

In an embodiment, the method further comprises the step of:

applying a first electric signal to the at least one conductive electrode so that a static electric field gradient is generated at the nucleus of the dopant atom to modify the energy of the nuclear spin states; and applying a second electric signal to the at least one conductive electrode so that an oscillating electric field gradient is generated at the nucleus of the dopant atom to induce transitions between the quantum mechanical states of the nuclear spin.

The voltage applied to the conductive electrode contributes to generating an electric field gradient at the donor atom. The electric field gradient is partially due to the applied field and partially due to the morphology of the semiconductor crystal in proximity of the dopant atom. The electric field gradient allows to modify the energy of the nuclear spin states.

Nuclear spins with quantum number I>½ possess an electric quadrupole moment, in addition to the usual magnetic dipole moment associated with the spin. The quadrupole may change its orientation in accordance with the direction of the electric field gradient. The principal axis of the static electric field gradient determines the preferred orientation of the nuclear quadrupole moment of the nucleus, resulting in a non-uniform spacing of the spin energy levels and, accordingly, non-uniform spin resonance frequencies.

The first electric signal may be applied in order to determine the preferred orientation of the nuclear quadrupole moment of the nucleus, resulting in a non-uniform spacing of the spin energy levels and, accordingly, non-uniform spin resonance frequencies.

In embodiments, the method further comprises the step of selecting a frequency of the oscillating electric field gradient to be equal to a spin transition frequency that causes the nuclear spin state to change by at least one quantum of angular momentum. The frequency of the oscillating electric field gradient may be selected to be equal to a spin transition frequency that causes the nuclear spin state to change by two quanta of angular momentum. When the dopant atom is in a neutral charge state, the frequency of the oscillating electric field gradient may be selected on the basis of the combined effect of a static external magnetic field, the static electric field gradient. Furthermore, the hyperfine coupling between a spin of the nucleus of the dopant atom and a charge bound to the dopant atom may be taken into account when selecting the frequency of the oscillating electric field gradient.

In some embodiments, the method further comprises the step of applying an oscillating magnetic field at a frequency corresponding to the excitation of the electron or hole spin of the dopant atom when the nuclear spin is in a specific quantum state to determine the quantum state of the dopant nuclear spin. The subsequent ionization of the dopant dependent upon the successful excitation of electron hole may signal that the nuclear spin was occupying the corresponding quantum state.

In some embodiments, the method further comprises the step of applying an oscillating electric field at a frequency corresponding to the excitation of the electron or hole spin of the dopant atom simultaneously to the de-excitation of the nuclear spin of the dopant atom by one quantum of angular momentum, to determine the quantum state of the dopant nuclear spin by observing the subsequent ionization of the dopant.

In some embodiments, the method further comprises the step of applying an oscillating electric field at a frequency corresponding to the excitation of the electron or hole spin of the dopant atom simultaneously to the de-excitation of the nuclear spin of the dopant atom by one quantum of angular momentum, to determine the quantum state of the dopant nuclear spin by observing the subsequent ionization of the dopant.

The dopant atom may bind either an electron or a hole to its nucleus. The total energy of the nuclear spin depends on the sum of the effects caused by the static external magnetic field (Zeeman energy), the hyperfine interaction between the nucleus and the charge (electron or hole) bound to the dopant, and the interaction between the nuclear quadrupole and the electric field gradient created by the strain in the lattice and/or the electric field pattern produced by the voltages applied to the conductive electrodes above the dielectric material together with the microscopic environment of the donor. In this case, the application of an oscillating electric field at the location of the atom has two effects: it directly affects the wavefunction of the electron or hole bound to the dopant atom, and consequently modulates its hyperfine interaction with the nucleus.

In embodiments, at least a portion of semiconductor surrounding the dopant atom is strained inducing an additional component of the electric field gradient.

In accordance with a second aspect, the present invention provides a quantum processing element comprising:
  a semiconductor and a dielectric material forming an interface with the semiconductor;

a dopant atom with nuclear spin of quantum number larger than ½ embedded in the semiconductor at a distance from the interface;
  at least one conductive electrode disposed in a manner such that there is at least a portion of dielectric material between the at least one conductive electrode and the dopant atom; and
  wherein the at least one conductive electrode is arranged so that, by applying a voltage to the at least one conductive electrode, an electric field gradient is generated at a nucleus of the dopant atom and enables encoding of quantum information in the nuclear spin of the nucleus.

In one embodiment, the encoding of the quantum information on the nucleus occurs via the quadrupole interaction.

In an embodiment, the voltage is such that multiple quantum bits may be encoded in the nuclear spin of the nucleus. In particular, the voltage may be controlled to encode multiple qubits on different energy levels of the nuclear spin of the nucleus.

In an embodiment, the at least one conductive electrode is arranged in a manner such that the voltage applied to the electrode contributes to creating an electric field gradient at the dopant atoms that modifies the energy of the nuclear spin states. The quadrupole may change its orientation in accordance with the direction of the electric field gradient. The principal axis of the static electric field gradient determines the preferred orientation of the nuclear quadrupole moment of the nucleus, resulting in a non-uniform spacing of the spin energy levels and, accordingly, non-uniform spin resonance frequencies.

An oscillating voltage signal may also be applied to the electrode to contribute to the electric field gradient generated at the dopant atom inducing transitions between the quantum mechanical states of the nuclear spin.

In some embodiments, the at least one conductive electrode comprises:
  a first conductive electrode arranged to apply a static electric field across the dopant atom; and
  a second conductive electrode arranged to apply an oscillating electric field across the dopant atom.

The at least one conductive electrode may comprise further one or more electrodes arranged to control or readout information from the processing element.

In accordance with a third aspect, the present invention provides a method of sensing strain in a crystalline semiconductor material using the quantum processing element of the second aspect, the method comprising:
  applying a static magnetic field to the dopant atom to separate the energies of the spin states associated with the nucleus of the dopant atom;
  measuring nuclear spin transition frequencies of the dopant atom; and
  calculating one or more values of lattice strain of the semiconductor crystal in proximity of the dopant atom by analysing the nuclear spin transition frequencies.

In some embodiments, the method further comprises the step of applying a biasing voltage to the at least one conductive electrode before measuring the nuclear spin transitions.

The method may be performed a number of times with different biasing voltages in order to obtain a more precise value of strain.

In embodiments, the step of calculating one or more values of lattice strain of the semiconductor crystal comprises calculating one or more electric field gradient values at the nucleus.

The step of calculating one or more electric field gradient values at the nucleus may comprise deconvoluting a portion of electric field gradient due to the applied biasing voltage from the portion of electric field gradient due to the lattice strain.

In embodiments, the step of calculating one or more values of lattice strain of the semiconductor crystal comprises comparing one or more values of the electric field gradient with respective values of the gradient elastic tensor of the semiconductor material.

In a semiconductor lattice, strain can have different values along different crystalline directions. A strain tensor can be calculated using the method disclosed herein by applying the static magnetic field to the dopant atom along a number of directions and measuring nuclear spin transition frequencies of the dopant atom for each applied magnetic field.

The strain tensor can be calculated by processing the measurement information all at once or, alternatively a value of strain along one direction can be calculated for each value of applied magnetic field. A strain tensor can then be compiled using the calculated strain values.

In some embodiments, three orientations of magnetic field are applied and for each applied field, two biasing voltages are used to calculate strain values.

For electrons, it has been shown that the application of oscillating electric fields can result in quantum mechanical transitions between the different spin states of the nucleus, either through a modulation of the anisotropic component of the hyperfine tensor, or through a modification of the quantization axis of the electron spin. These modulations of the electron wave function effectively convert an oscillating electric field into an oscillating magnetic field (the hyperfine field) which has a component perpendicular to the static magnetic field. Therefore, even though the applied oscillating field is of electrical nature, the resulting process of nuclear spin manipulation remains a form a magnetic resonance.

The present disclosure, however, provides a method that does not necessarily require any magnetic resonance to induce nuclear spin transitions by leveraging the effect of the electric field gradient on the nuclear quadrupole moment of the nucleus.

In order to demonstrate the electrically controlled nuclear spin transitions, the inventors designed an experiment where the dopant atom is kept in an ionized state, i.e. the electron or hole that would be bound to it to retain charge neutrality have been removed. The total energy of the nuclear spin depends on the sum of the effects caused by the static external magnetic field (Zeeman energy), and the interaction between the nuclear quadrupole and the electric field gradient created by the strain in the lattice and/or the electric field pattern produced by the voltages applied to the conductive electrodes above the dielectric material and microscopic crystal lattice effects in proximity of the dopant atom. The application of an oscillating electric field at the location of the atom affects the nuclear spin through the coupling of the electric field gradient to the nuclear quadrupole moment only.

An oscillating electric field gradient is produced at the location of the nuclear spin by applying oscillating voltages to one or multiple conductive electrodes, arranged on the surface of a dielectric material, and placed in the vicinity of one or multiple electrodes which are kept at a constant electrical potential.

The quantum state of the nuclear spin is read out by applying time-dependent electric and magnetic fields and by performing a subsequent readout of the electron spin. The electron spin readout procedure is described in U.S. Pat. No. 8,507,894 the disclosure of which is incorporated herein by reference.

The nuclear spin read out procedure is performed by the following steps in accordance with embodiments:

the voltage on one or multiple conductive electrodes placed on top of the dielectric and in the vicinity of the nucleus is tuned in such a way that the most energetically favourable charge state of the system comprises an electron or a hole bound to the nucleus;

the voltage on one or multiple conductive electrodes placed on top of the dielectric and in the vicinity of the nucleus is tuned in such a way that an electron or a hole are bound to the nucleus only if their spin is in the lowest energy state;

after an electron or hole in its spin ground state has been bound to the nucleus, an oscillating magnetic field is applied to the electron or hole spin in order to excite it from the ground state to an excited state;

the frequency of the oscillating magnetic field is chosen in such a way that it matches the resonance frequency of the electron or hole, under the condition that the nuclear spin occupies a specific quantum state. This resonance condition results from the combined effect of an externally applied static magnetic field, the electron-nuclear hyperfine interaction, and the static value of the nuclear quadrupole energy. This process results in the excitation of the electron or hole spin conditional on the nuclear spin occupying a specific quantum state;

the voltage on one or multiple conductive electrodes placed on top of the dielectric and in the vicinity of the nucleus is tuned in such a way that an electron or a hole escape the nucleus only if their spin is in an excited energy state. If the nuclear spin was in the chosen state during the preceding step, the electron or hole will therefore leave the nucleus, leaving behind a net charge; and a charge-sensitive device, for example a single-electron transistor or a quantum point contact, is placed in the vicinity of the dopant atom. The ionization of the dopant atom described at the previous step produces a net charge which has the effect of changing the conductivity of the charge-sensitive device. The detection of the conductivity change is equivalent to the observation that the nuclear spin was in the quantum state that correlates to the resonance frequency of the electron or hole that was used during the application of the oscillating magnetic field.

One of the main advantages of the techniques described herein is that every operation, from control to readout, can be performed using only electric fields. Whereas, generally, it was believed that an oscillating magnetic field was crucial for control, or readout, or both.

The quantum state of the nuclear spin is read out via the following steps, which are undertaken making use of time-dependent electric fields only. The readout procedure is also described in PCT application AU2016/050422 which is incorporated herein by reference.

The voltage on one or multiple conductive electrodes placed on top of the dielectric and in the vicinity of the nucleus is tuned in such a way that the most energetically favourable charge state of the system comprises an electron or a hole bound to the nucleus;

the voltage on one or multiple conductive electrodes placed on top of the dielectric and in the vicinity of the nucleus is tuned in such a way that an electron or a hole are bound to the nucleus only if their spin is in the lowest energy state;

with the electron or hole bound to the nucleus, the voltage on one or multiple conductive electrodes placed on top of the dielectric and in the vicinity of the nucleus is tuned in such a way that the wavefunction of the electron or hole bound to the nucleus is distorted by displacing it towards the interface between the semi-conductor and the dielectric. In this configuration, the hyperfine coupling between nucleus and electron or hole becomes very sensitive to small additional varia-tions of the voltages on the conductive electrodes;

an oscillating voltage is applied to one or multiple con-ducting electrodes to time-dependently modulate the strength of the hyperfine coupling between nucleus and electron or hole;

the frequency of the oscillating voltage is chosen to be in or close to resonance with the frequency at which the nuclear spin would undergo a quantum transition to a lower value of its projection along the quantization axis set by the direction of the external static magnetic field, while at the same time the electron or hole undergo a quantum transition in the opposite direction, thus pre-serving the total component of the angular momentum along the quantization axis. This process results in the excitation of the electron or hole spin conditional on the nuclear spin occupying a specific quantum state;

the voltage on one or multiple conductive electrodes placed on top of the dielectric and in the vicinity of the nucleus is tuned in such a way that an electron or a hole escape the nucleus only if their spin is in an excited energy state. If the nuclear spin was in the chosen state during the preceding step, the electron or hole will therefore leave the nucleus, leaving behind a net charge; and a charge-sensitive device, for example a single-electron transistor or a quantum point contact, is placed in the vicinity of the dopant atom. The ionization of the dopant atom described at the previous step produces a net charge which has the effect of changing the con-ductivity of the charge-sensitive device. The detection of the conductivity change is equivalent to the obser-vation that the nuclear spin was in the quantum state that correlates to the resonance frequency of the elec-tron or hole that was used during the application of the oscillating electric field.

BRIEF DESCRIPTION OF THE DRAWINGS

Features and advantages of the present invention will become apparent from the following description of embodi-ments thereof, by way of example only, with reference to the accompanying drawings, in which:

FIG. 1 is a schematic illustration of a top view (a) and two side cross-sectional views (b,c) of a quantum device;

FIG. 8 shows the experimentally obtained resonance spectrum of a single $^{123}$Sb nuclear spin;

FIG. 11 is a flow diagram of a method for operating a quantum processing element in accordance with embodi-ments.

DETAILED DESCRIPTION OF EMBODIMENTS

Figure 2:
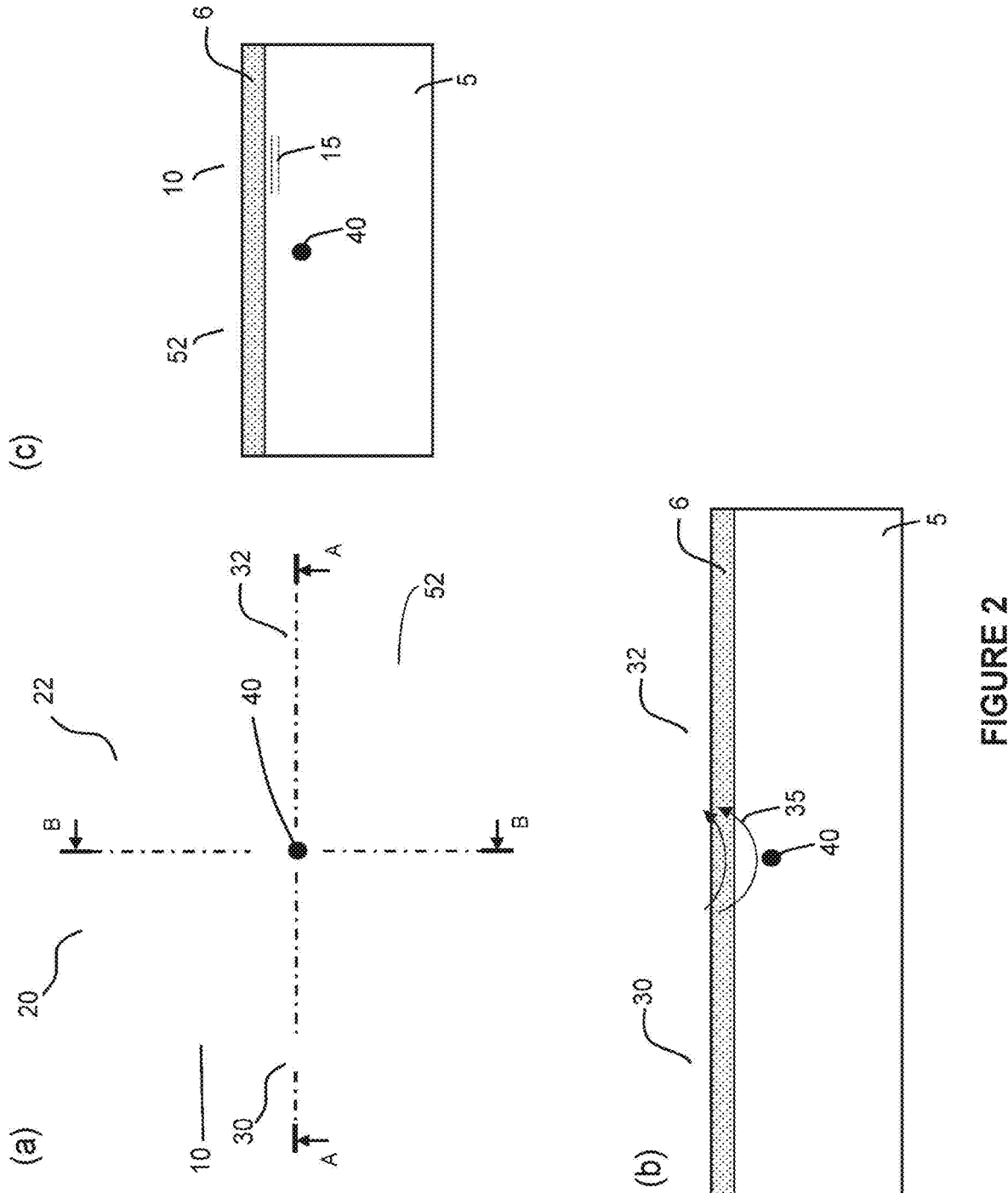
FIG. 2 is a schematic illustration of a top view (a) and two side cross-sectional views (b,c) of a quantum device.

One of the earliest proposals for scalable qubit systems was that of Kane, which describes a silicon-based quantum computer, where information is encoded in the quantum states of individual $^{31}$P nuclear spins. The ideas of Kane have been further developed and refined over the years, and long coherence times of nuclear spin qubits in silicon have been experimentally confirmed [J. Muhonen et al., Nature Nanotechnology 9, 986 (2014)], but at present most of the attention is focused on electron, rather than nuclear spins as carriers of quantum information.

Electrical control of electron spin qubits has been dem-onstrated in several alternatives mode of operation. In mate-rials with strong intrinsic spin-orbit coupling, such as the III-V compound semiconductors like GaAs or InAs, spin manipulation can be achieved directly by applying alternat-ing electric fields [K. Nowack et al., Science 318, 1430 (2007)]. In materials like silicon, where spin-orbit coupling is weak, electric control is typically achieved by generating an artificial coupling between the electron position and its spin energy via an inhomogeneous magnetic field produced by a micromagnet [E. Kawakami et al., Nature Nanotech-nology 9, 666 (2014)].

Nuclear spins, on the contrary, do not possess an intrinsic electric dipole. Until recently, it has been assumed that the only way to manipulate nuclear spins was by the traditional method of magnetic resonance, which requires the applica-tion of very strong alternating magnetic fields.

Quantum information does not have to be encoded nec-essarily in two-level systems (qubits). It has also been suggested that it can be encoded in d-level systems, with d>2. Such systems are called qudits. Their use is rare compared to the more established qubits, but there are examples in photonic systems [B. Lanyon et al., Nature Physics 5, 134 (2005)] or superconducting transmons [R. Bianchetti et al., Physical Review Letters 105, 223601 (2010)]. Because of the larger computational space, qudits can be used advantageously to perform certain quantum logic operations without necessitating the interaction between multiple physical objects.

Nuclear spins with spin quantum number larger than ½ can also be used as qudits, since they have more than two quantum mechanical states. A recent experiment has shown the execution of Grover's quantum search algorithm on the quantum states of a Terbium nuclear spin [C. Godfrin et al., Physical Review Letters 119, 187702 (2017)]. In this experi-ment, the nuclear spin states were manipulated using an oscillating electric field which distorted the electronic wave-function, resulting in an effective oscillating magnetic field on the nucleus through the modulation of the transverse component of the electron-nuclear hyperfine interaction. Nuclear spins with quantum number $>\frac{1}{2}$ also possess a nuclear quadrupole moment.

The inventors realised that the quadrupole moment can be energetically affected by the presence of a gradient of electric field, which favours the orientation of the atomic nucleus along a certain direction set by the field gradient. In certain crystalline solids, the quantum states of nuclear spins with nonzero quadrupole moments can be observed by performing magnetic resonance experiments, where the energy difference (and therefore the resonance frequency) between different states is provided by the coupling between the nuclear quadrupole and the local electric field gradient caused by the charge distribution in the proximity of the nucleus. The study of magnetic resonance transitions between nuclear states separated in energy by electric qua-drupole interaction is called Nuclear Quadrupole Resonance (NQR).

In general, an energy splitting from nuclear quadrupole effects necessitates a crystalline symmetry other than cubic, in order to attain an electric field gradient at the nuclear site. Therefore, materials with cubic crystalline structure (such as silicon) do not generally exhibit NQR. In order to overcome this, the inventors realised that the cubic crystal symmetry can be artificially broken by applying tensile or compressive strain to the crystal. A nuclear spin $I>\frac{1}{2}$ placed in such strained crystal will then exhibit a finite nuclear quadrupole splitting.

In the following description a method for encoding and reading out quantum information in a qudit based on a nuclear spin with quantum number $I>\frac{1}{2}$ in accordance with embodiments is described.

Referring now to FIG. 1, there is shown a schematic illustration of a device that embodies the invention. In the case of FIG. 1, the readout of the quantum state of the nuclear spin is accomplished via the magnetic resonance of the spin of an electron.

FIG. 1(a) is a top view of the processing element, FIG. 1(b) is a side cross-section along the section A-A, and FIG. 1(c) is a side cross-section along the section B-B. The processing element may be used as a qudit element for a quantum computer comprising a plurality of these process-ing elements. In the embodiment of FIG. 1, the processing element comprises a semiconductor substrate 5 and a dielec-tric 6, in this example being silicon and silicon dioxide respectively. A donor atom 40 is located within the substrate 5. By way of example, it is assumed here that the donor is a $^{123}$Sb atom. The donor can be introduced into the substrate using nano-fabrication techniques, such as the hydrogen lithography provided by scanning-tunneling-microscopes, or the industry-standard ion implantation techniques. The methods described herein may be applied to processing elements consisting of dopant atoms that act as acceptors instead of donors, and semiconductors other than silicon, provided the nucleus of the dopant atom possess a nonzero quadrupole moment. This requires that the spin quantum number of the dopant is $I>\frac{1}{2}$.

The nuclear quadrupole interacts with a gradient of elec-tric field. In this example, two conductive electrodes 30 and 32 are placed above the dielectric 6 and their electrical potential is controlled by voltage sources (not shown). By appropriate choice of the voltages on electrodes 30 and 32, a spatially inhomogeneous electric field 35 is created at the location of the donor nucleus. This spatially inhomogeneous electric field is created in part by the applied voltage on electrodes 30 and 32 and, typically in even larger part, by microscopic phenomena taking place in the lattice in prox-imity of the nucleus under the effect of the electric field produced by electrodes 30 and 32. A nonzero electric field gradient tends to align the nuclear quadrupole of the dopant atom along its direction. Such inhomogeneous electric field can also be achieved with other configurations of electrodes, even a single one, or more than two.

If the semiconductor crystal that hosts the dopant atom does not exhibit a cubic symmetry, either intrinsically (as in III-V compound semiconductors) or because of a uniaxial strain applied to a cubic crystal like silicon, this also results in a local electric field gradient that significantly influences the energy of the dopant atom's nucleus. The net effect is the same as that of an electric field gradient obtained by suitable choice of externally applied voltages on conductive elec-trodes.

The quantum state of the nucleus' spin is controlled by applying an oscillating voltage $E_{ac}$ on electrodes 30 and 32 (or only one of the two, or other combinations of electrodes), with a frequency that matches the energy difference between two nuclear spin orientations, divided by the Planck's con-stant, as detailed further below.

The complete operation of the processing device neces-sitates also a method to read out and initialize the quantum state of the nucleus.

Referring now to the embodiment described in FIG. 1, the processing device contains, in addition to the conductive electrodes 30 and 32, which are used to alter the quantum state of the nucleus, a conductive structure 50 which is shaped to constitute a high-frequency transmission line, terminated by a short circuit. This structure 50, when excited by an AC voltage, produces an alternating current through the short circuit which results in the production of an AC magnetic field $B_{ac}$ 55 at the location of the nucleus 40. In this embodiment, the AC magnetic field 55 has the purpose of inducing quantum mechanical transitions in the spin states of the electron, as further described in FIG. 6.

An additional device is provided in this embodiment for the purpose of reading out the state of the electron spin. It consists of a metallic electrode 10 which is overlaid atop two barrier electrodes 20 and 22, with a thin insulating layer between electrode 10, and electrodes 20 and 22. When biased with a sufficiently positive voltage, electrode 10 induces an electron layer 15 under the dielectric 6. The barrier electrodes 20 and 22 interrupt the electron layer 15 at two points, and isolate an island containing a finite number of electrons (typically around 100). In this embodi-ment, the device constitutes a single-electron transistor, which possesses a highly nonlinear current-voltage charac-teristic. The dopant atom 40 is placed close enough to the electron layer 15 to be tunnel-coupled to it, meaning that an electron can be moved between the atom 40 and the electron layer 15 by quantum mechanical tunneling through an energy barrier. Changing the charge state of the dopant atom 40 produces a change in the conductance of the single-electron transistor. The change of conductance can be detected using low-noise electronics, and correlated to the charge state of the atom, which itself is correlated with the spin state of the electron. An example of how this type of processing device can read out the quantum state of a single nuclear spin has been described, for example, in J. Pla et al., Nature 496, 334 (2013).

Referring now to FIG. 2, there is shown a schematic illustration of a top view (a) and two side cross-sectional views (b,c) of a device that embodies the invention. In the device shown in FIG. 2, the readout of the quantum state of the nuclear spin is accomplished via the electrically-driven resonance of the combined spin states of the nucleus and of an electron.

The device shown in FIG. 2 differs from the one in FIG. 1 by the way the state of the nuclear spin is read out. Instead of applying an AC magnetic field to excite the electron spin, here an AC electric field 35 of appropriate frequency is employed. It can be delivered by the same electrodes 30 and 32 used to control the nuclear spin state, or by other configurations of electrodes.

Figure 3:
FIG. 3 is a scanning electron microscope image of the device illustrated in FIG. 1.

FIG. 3 is a scanning electron micrograph of a device that embodies the processing apparatus in a way similar to that schematically depicted in FIG. 1. It contains a single-electron transistor for spin readout, composed of electrodes 10, 20, 22; a high-frequency transmission line 50 for delivering an AC magnetic field to the dopant; a series of conductive electrodes 30, 32 to control the quantum state of a 123Sb dopant atom 40, which has been implanted in the silicon substrate, in a volume approximately in between the tips of electrodes 30 and 32, and below a layer of silicon oxide 6 which covers the silicon substrate. This particular device contains other electrodes for additional flexibility in influencing the electrostatic potential within the device, but do not change its basic mode of operation.

Figure 4:
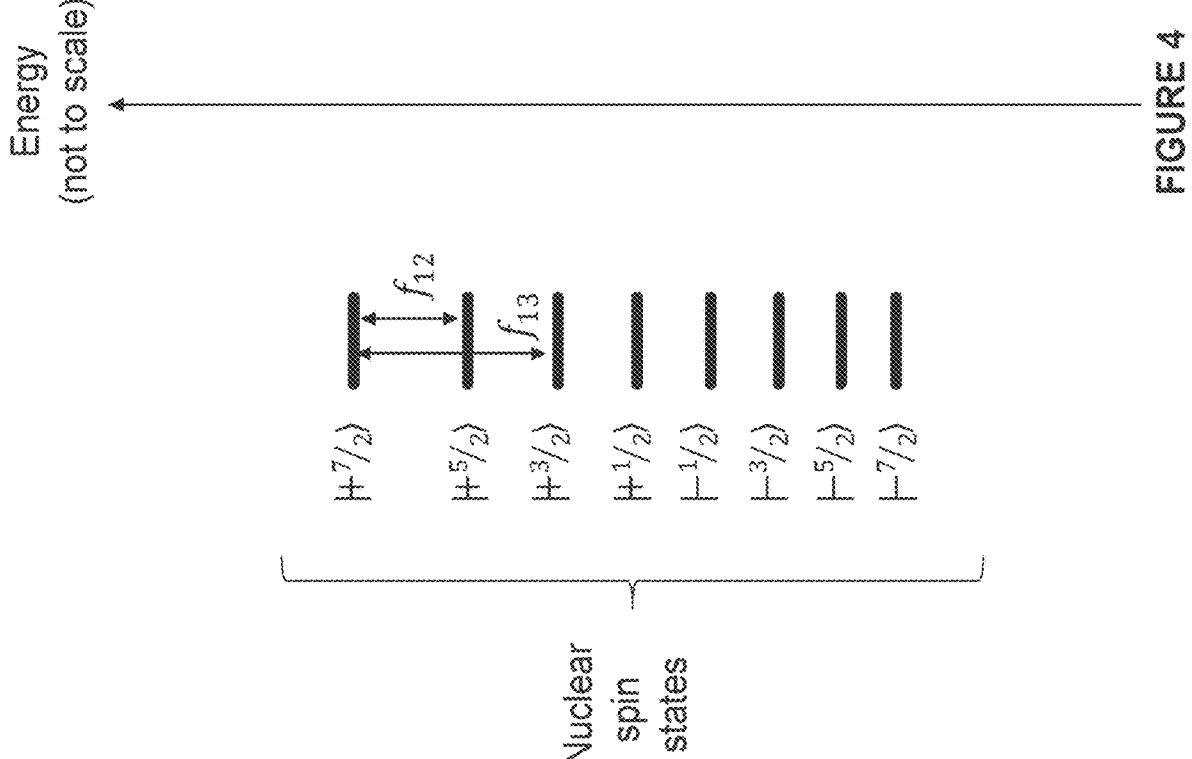
FIG. 4 is a schematic illustration of the energy of the nuclear spin quantum states of a $^{123}$Sb atom in silicon.

FIG. 4 is a schematic illustration of the energy of the nuclear spin quantum states of a $^{123}$Sb atom introduced in a silicon crystal as substitutional donor. The illustration assumes that the $^{123}$Sb donor is in a positive charge state. The different spin projections have different energy in the presence of a static external magnetic field.

When placed in a static magnetic field $B_0$, and subjected to a static electric field gradient which introduces a nuclear quadrupole energy $Q_0 I_\alpha^2$ term in the spin Hamiltonian. The effect of the nuclear quadrupole coupling is to render the energy gap between different nuclear spin projections unequal. This has the important consequence that each quantum mechanical transition between each pair of states occurs at a different frequency.

This invention discloses the use of AC electric field gradients to induce transitions between different nuclear spin states of individual dopant atoms.

The spin Hamiltonian that describes the energy of the electron (or hole) and the nucleus of the dopant atom can take two possible forms.

The first form is found when the dopant is in its neutral charge state, where it weakly binds an electron (in the case of a donor) or a hole (in the case of acceptors). Described here by way of example is the case of a Sb donor atom in silicon, but the same reasoning applies to other donors, or to acceptors, and to other semiconductor host materials. Calling S the spin operator of the electron and I that of the nucleus, the static spin Hamiltonian reads:

$$H \approx (\gamma_e S_z + \gamma_n I_z) B_0 + A \vec{S} \cdot \vec{I} + Q_0 I_\alpha^2$$

Where $B_0$ is a static (constant) externally applied magnetic field. Its direction defined the z axis of the coordinate system. $S_z$ and $I_z$ are the operators describing the projections of the electron and the nuclear spins, respectively, along the z-axis. $\gamma_e$ and $\gamma_n$ are the gyromagnetic ratios of the electron and the nucleus, respectively. A is the electron-nuclear hyperfine interaction. $Q_0$ is a quantity that describes the interaction of the nuclear quadrupole moment with a static electric field gradient. The electric field gradient is oriented along the direction $\alpha$, defined in a system of coordinates where the static magnetic field $B_0$ sets the direction of the z-axis. The direction $\theta$ can be arbitrary, but should not make of 45 or 135 degrees with respect to the z-axis. If the angle between $\alpha$ and z is 45 or 135 degrees, the nuclear quadrupole coupling will not result in a shift of the nuclear spin resonance transitions, and therefore will not permit the addressability of the individual nuclear states by spin resonance techniques.

The second form is found when the dopant atom is in an ionized charge state, having had its electron (in case of a donor) or hole (in case of an acceptor) removed by suitable application of voltages on nearby conductive electrodes. In this case, the hyperfine coupling and the electron (or hole) spin are absent, and the spin Hamiltonian becomes simply:

$$H \approx \gamma_n I_z B_0 + Q_0 I_\alpha^2$$

The invention disclosed here pertains a method to control the quantum state of the nuclear spin by using electric fields only. In particular, it pertains a method where the quantum mechanical transitions between different nuclear spin orientations is obtained via the modulation of the nuclear quadrupole energy through an AC electric field gradient $Q_1 I_\beta^2$, generated via the application of an AC (oscillating) electric field $E_{ac}$. The primary quadrupole axis $\beta$ of the AC electric field gradient is not necessarily equal to the primary axis $\alpha$ of the static quadrupole, and generally depends on the device geometry, in particular the location of the conductive electrodes with respect to the dopant atom. In the laboratory frame, the quadrupole interaction can be decomposed into $$Q_1 I_\beta^2 = \sum_{i,j \in \{x,y,z\}} Q_{1,ij} I_i I_j,$$

where $\{x,y,z\}$ are the laboratory frame axes, and $Q_{1,ij}$ is the AC quadrupole contribution along axes i, j.

There are two ways in which $\Delta Q_1 I_\beta^2$ can induce transitions between nuclear spin states:

Transitions between neighbouring quantum eigenstates ($\Delta m = \pm 1$), induced by terms in the quadrupole decomposition having one of the two spin operators along the z-axis (e.g. $Q_{1,xz} I_x I_z$).

Transitions between next-nearest-neighbouring eigenstates ($\Delta m = \pm 2$), induced by terms having no spin operator along the z-axis (e.g. $Q_{1,xx} I_x^2$). The orientation of the quadrupole with respect to the laboratory frame will determine the relative strength of transitions between neighbouring and between next-nearest-neighbouring quantum eigenstates.

Figure 5:
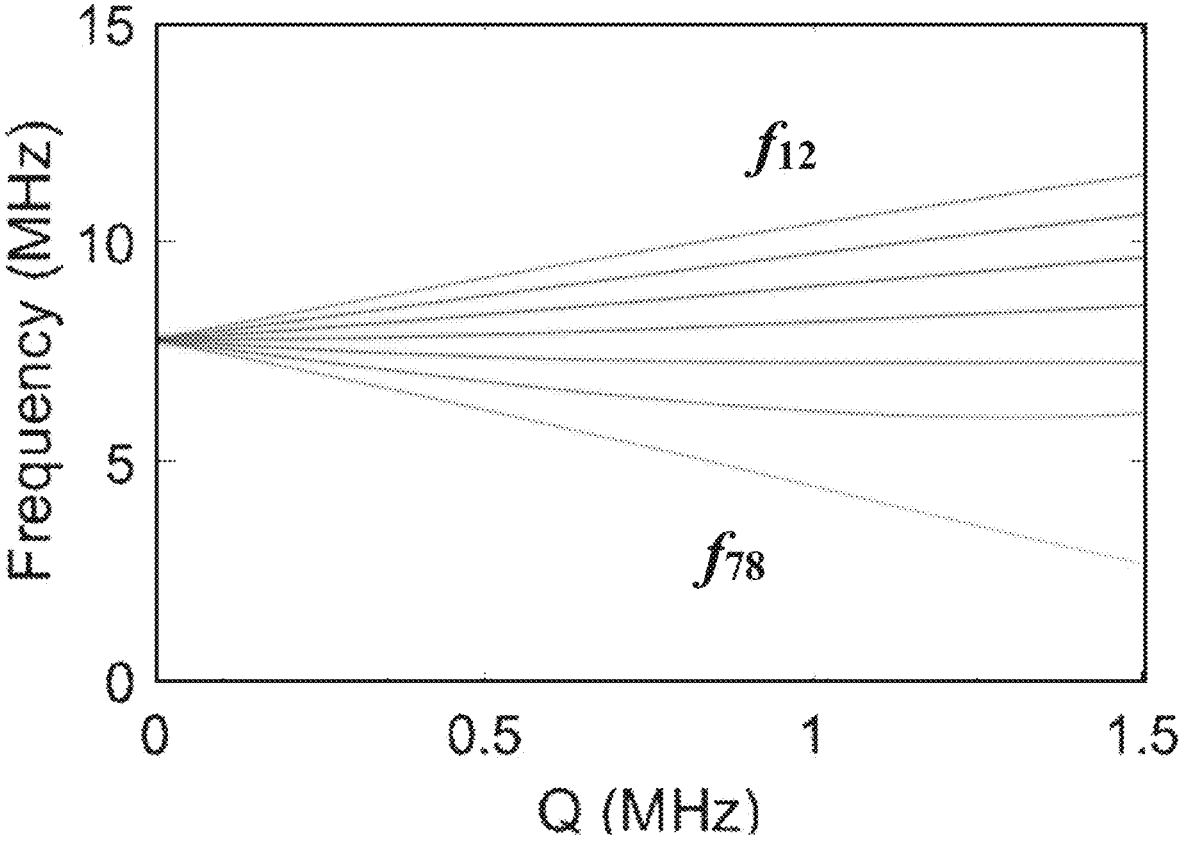
FIG. 5 is a calculation of the spin resonance frequencies of a $^{123}$Sb in the presence of a static magnetic field, plus a static nuclear quadrupole interaction Q.

FIG. 5 shows a calculation of the frequencies for $\Delta m = \pm 1$ spin transitions of a $^{123}$Sb nucleus, assuming a static magnetic field $B_0 = 1.4$ T, as a function of the value of the static nuclear quadrupole coupling Q. The figure shows how a modest value of Q allows to separate the individual spin resonance frequencies well enough to permit the individual control of each pair of states.

An arbitrary quantum state of the nucleus can be produced by sequences of pulses of AC electric field gradient of appropriate frequency, amplitude, phase and duration, according to the following Hamiltonian:

$$H \approx \gamma_n I_z B_0 + Q_0 I_\alpha^2 + Q_1 I_\beta^2 \cos(2\pi ft)$$

Where $Q_1 I_\beta^2 \cos(2\pi ft)$ describes the interaction between the gradient of the AC electric field $E_{ac}$ and the nuclear quadrupole. Note that this gradient can be oriented along a direction $\beta$ which is different from that of the static term along a, since the static quadrupole term $Q_0 I_\alpha^2$ can arise from strain in the host crystal, whereas the AC term $Q_1 I_\beta^2$ is generated by the electrodes 30 and 32.

It would be understood that other methodologies may be used, such as strain modulation by application of an AC voltage to piezo actuators.

A method to design sequences of control pulses for multi-level quantum systems such as nuclear spin with $I>\frac{1}{2}$ has been described, for example, in M. Leuenberger and D. Loss, Physical Review B 68, 165317 (2003), assuming that the transitions between different spin states are induced by conventional magnetic resonance. Embodiments of the present invention disclose how to achieve the same result without using AC magnetic fields, but applying electric field gradients only, and without involving a conversion of AC electric fields into effective AC magnetic fields through the modification of an electron spin wavefunction.

Figure 6:
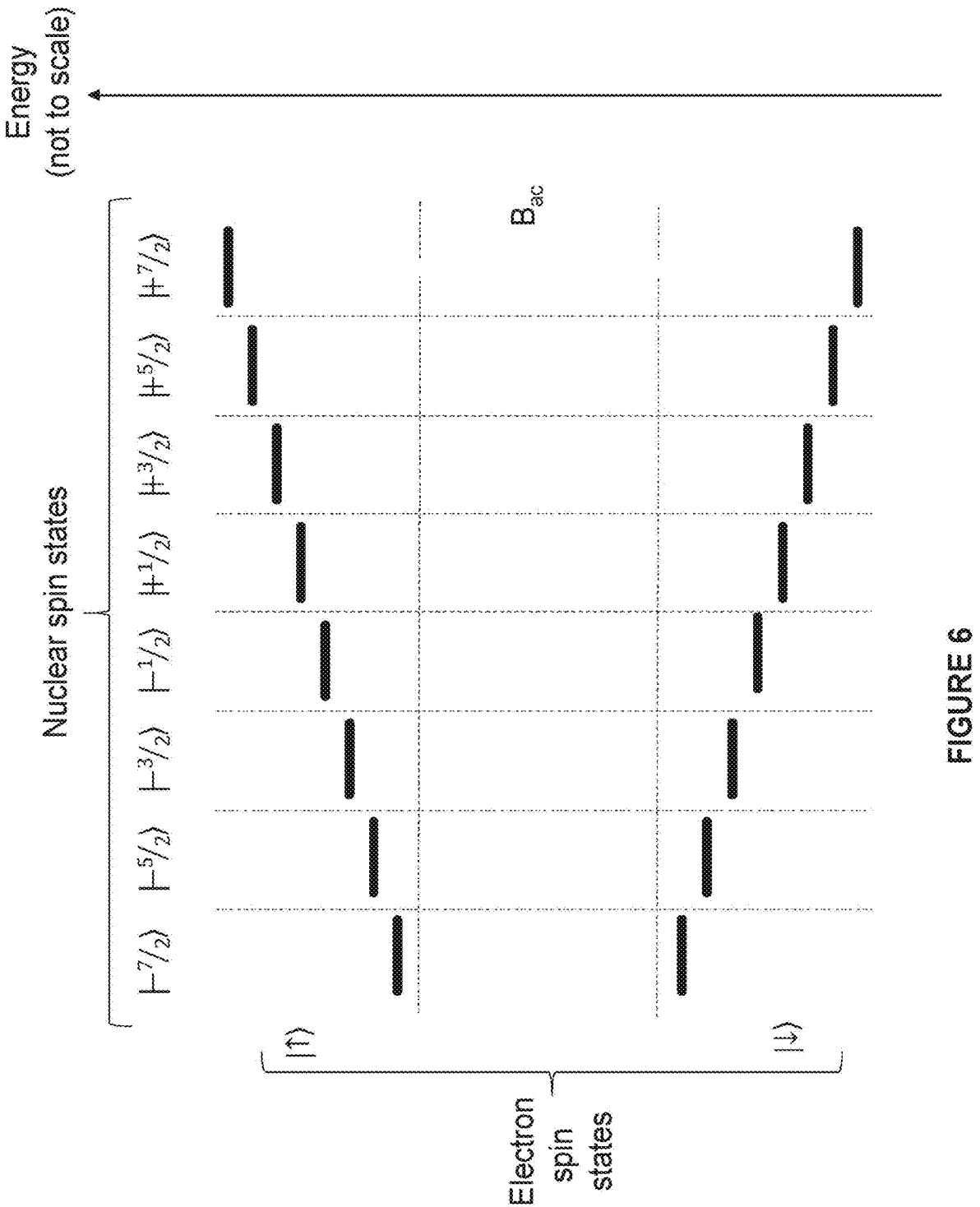
FIGS. 6 and 7 are schematic illustrations of the energy of the spin states of a $^{123}$Sb atom in silicon, in a neutral charge state.

FIG. 6 is a schematic depiction, by way of example, of the energy states of a $^{123}$Sb atom in the neutral state, including the spin S of a weakly-bound electron. After the encoding of quantum information in the nuclear spin states, this charge and spin configuration is used to read out the nuclear spin state. The method constitutes the extension to $I>\frac{1}{2}$ of the readout method used with 31P atom, which does not possess a nuclear quadrupole moment.

The illustration in FIG. 6 is drawn assuming that there is a static magnetic field applied to the atom. Transitions between quantum states of the atom that differ only by the orientation of the donor-bound electron spin (keep the nuclear spin orientation unchanged) are induced by an oscillating magnetic field $B_{ac}$.

Considering for example a $^{123}$Sb donor with its electron spin prepared in the state $|\downarrow\rangle$, applying an AC magnetic field at the frequency corresponding to the transition $|\downarrow, +7/2\rangle \rightarrow |\uparrow, +7/2\rangle$ will excite the electron spin to the $|\uparrow\rangle$ state only if the nuclear spin occupies the $|+7/2\rangle$ state. Once excited to the $|\uparrow\rangle$ state, the electron can be made to tunnel out of the donor and into a nearby electron layer, leaving behind a positive charge which changes the electrical conductivity of a charge-sensitive device fabricated in the proximity of dopant atom. The change in electrical conductivity can be detected in real time by a suitable choice of low-noise electronics [A. Morello et al., Nature 467, 687 (2010)]. Overall, the process relates a change in electrical conductivity with the detection of a specific quantum state of the nucleus. In this example, absence of change in conductivity signifies that the nucleus was not in the $|+7/2\rangle$ state. The precise state can be identified by repeating the process using electron spin resonance frequencies corresponding to each one of the other nuclear states, until the correct one is found.

Figure 7:
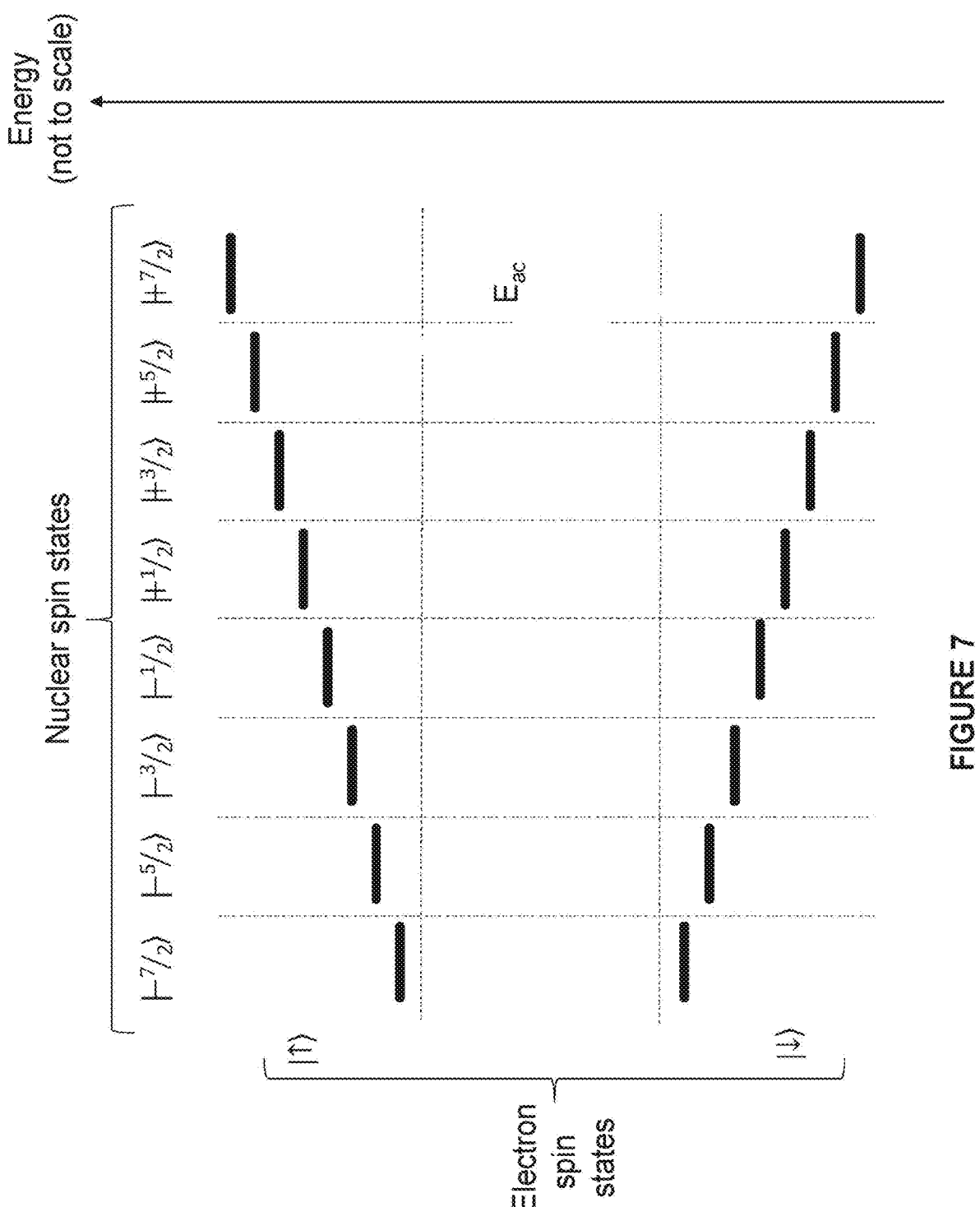

FIG. 7 illustrates the system as FIG. 6, where nuclear spin readout is achieved using AC electric fields (see FIG. 2). FIG. 7 shows, by way of example, a $^{123}$Sb donor atom with its electron spin prepared in the state $|\downarrow\rangle$. Applying an AC electric field at the frequency corresponding to the transition $|\downarrow i, +7/2\rangle \rightarrow |\uparrow, +5/2\rangle$ will excite the electron spin to the $|\uparrow\rangle$ state only if the nuclear spin occupied the $|+7/2\rangle$ state at the start of the application of the AC electric field pulse. Once excited to the $|\uparrow\rangle$ state, the electron can be made to tunnel out of the donor and into a nearby electron layer, leaving behind a positive charge which changes the electrical conductivity of a charge-sensitive device fabricated in the proximity of dopant atom, and signals that the nuclear spin was initially in the $|+7/2\rangle$ state. If no change in electrical conductivity is detected, the process can be repeated until the correct nuclear spin state is found. If no change in conductivity is ever detected, this signals that the nuclear spin is in the $|-7/2\rangle$ state, which is the only one that does not couple to other states via AC electric fields.

FIG. 8 shows the experimental observation of the nuclear spin resonance transitions of a single $^{123}$Sb atom implanted in silicon. The measurements have been conducted on a device with the structure disclosed above with reference to FIG. 1. Panel (a) shows the nuclear spin resonance transitions corresponding to a change of a single quantum of angular momentum, $\Delta m=\pm 1$. Because of symmetry consideration, the central resonance $|-\frac{1}{2}\rangle \leftrightarrow |+\frac{1}{2}\rangle$ cannot be excited via this method. Panel (b) shows the nuclear spin resonance transitions corresponding to a change of a two quanta of angular momentum, $\Delta m=\pm 2$.

Figure 9:
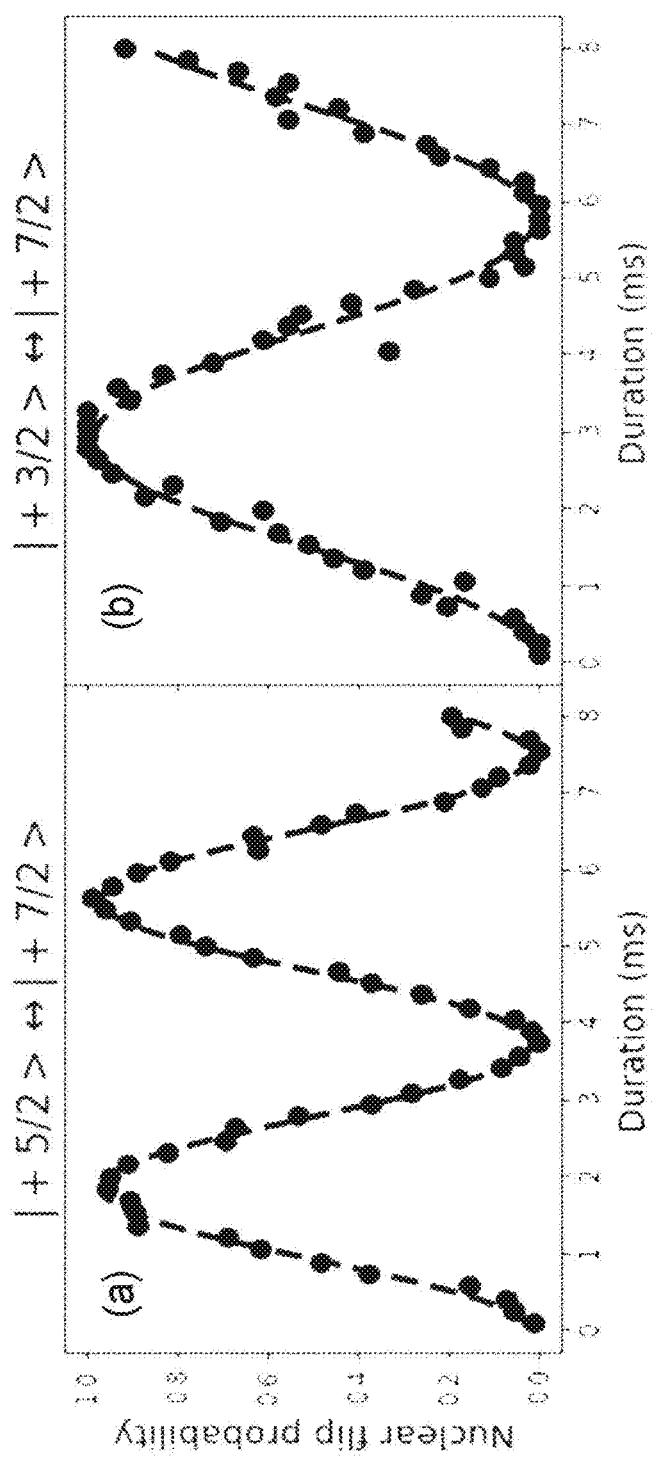
FIG. 9 shows the experimental demonstration of coherent quantum mechanical transitions obtained by applying an oscillating electric field gradient to the atom in ionized state.

FIG. 9 shows the experimental observation of coherent quantum oscillations (known as Rabi oscillations) between pairs of nuclear spin quantum states of a single $^{123}$Sb atom implanted in silicon, using the embodiment of the invention described by FIG. 1. Panel (a) shows the coherent oscillation between $|-7/2\rangle$ and $|-5/2\rangle$ states, while panel (b) shows the coherent oscillation between $|-7/2\rangle$ and $|-3/2\rangle$ states.

Figure 10:
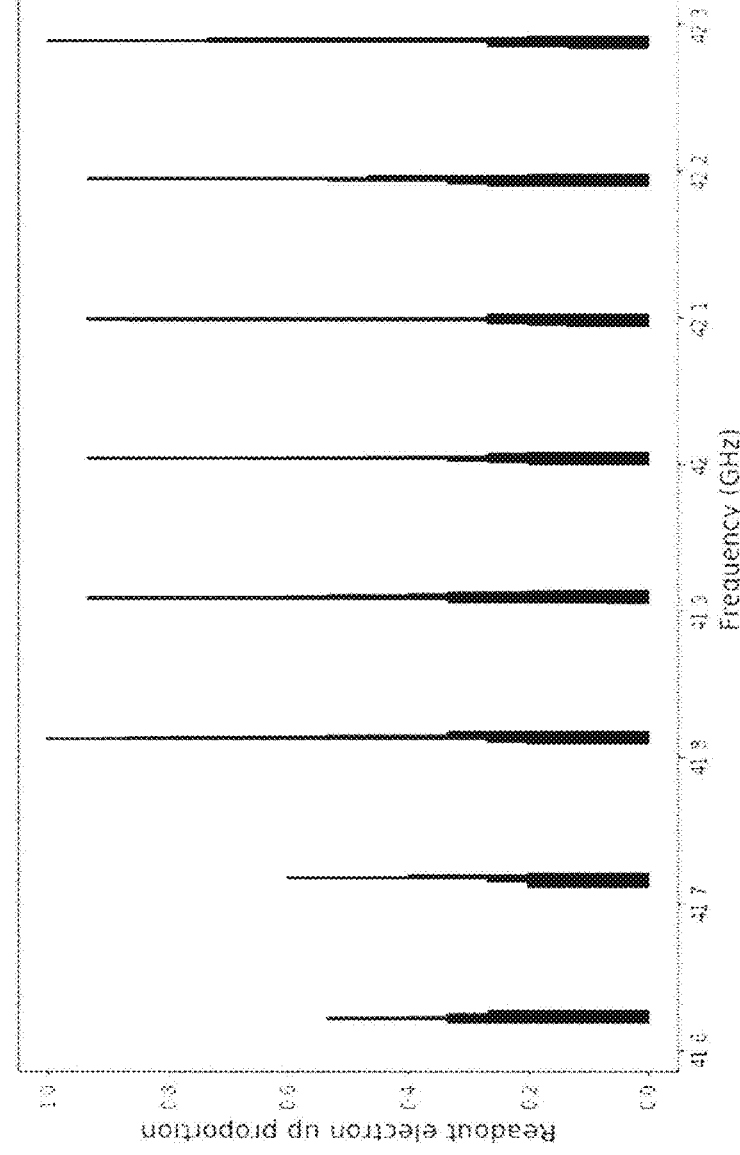
FIG. 10 shows the experimentally obtained resonance spectrum of a single $^{123}$Sb electron spin, using an oscillating magnetic field to induce transitions between the $|\downarrow\rangle$ and $|\uparrow\rangle$ states.

FIG. 10 shows the electron spin resonance spectrum of the electron spin bound to a single $^{123}$Sb atom implanted in silicon, using the embodiment of the invention described by FIG. 1. Each of the eight observed resonance lines corresponds to a specific quantum state of the $^{123}$Sb nuclear spin. Therefore, the observation of one specific resonance line constitutes the measurement of a specific quantum state of the nuclear spin, which acts as the nuclear spin processing element disclosed herein.

FIG. 11 is a high level flow diagram 80 of a method for operating a quantum processing element as disclosed above with reference to FIGS. 1 to 10. A magnetic field is applied at step 82 to the dopant atom to separate the energies of the spin states associated with the nucleus of the dopant atom. Once the energies are separated, a voltage is applied to the at least one conductive electrode, step 84, to generate an electric field gradient at a nucleus of the dopant atom. A portion of the electric field gradient generated at the nucleus can be due to microscopic effects of crystal structure in its proximity. At step 86, the quantum information is encoded in the nuclear spin of the nucleus via the applied voltage.

Embodiments of the device described herein can also be used to measure strain in cryogenic electronic devices. In several solid state quantum computing applications, crystal lattice strain affects the control and operation of the quantum processing elements and it is important to be able to quantify lattice strain at different locations across the device. Measuring strain at cytostatic temperatures can provide an indication of strain at room temperature. Therefore, the devices and methods disclosed herein may also have application in the broader integrated circuit industry.

Figure 12:
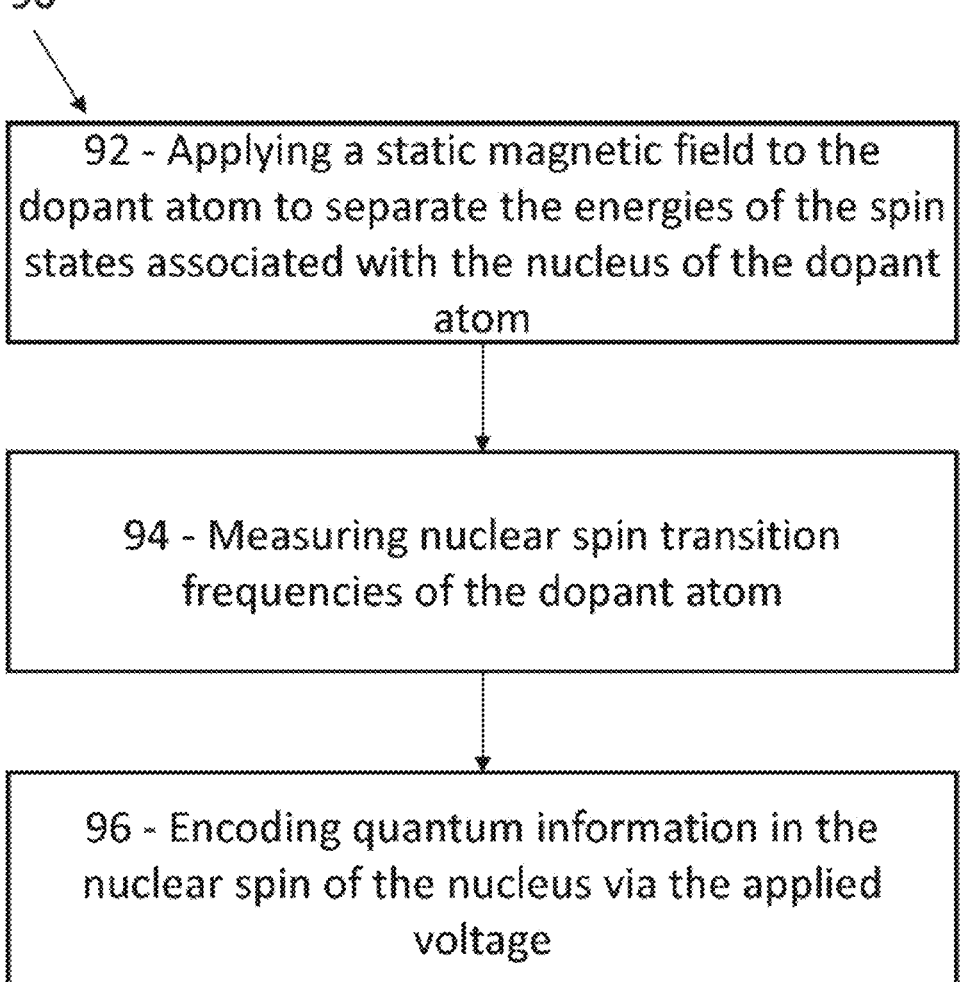
FIG. 12 is a flow diagram of a method for sensing strain in a crystalline semiconductor material using the device of FIG. 1

Referring now to FIG. 12, there is shown a high level flow diagram 90 of a method for operating the device of FIG. 1 as a strain sensor in a crystalline semiconductor.

A static magnetic field is applied to the dopant atom to separate the energies of the spin states associated with the nucleus at step 92. The nuclear spin transition frequencies of the dopant atom are measured, step 94. By analysing the nuclear spin transition frequencies, one or more values of lattice strain of the semiconductor crystal in proximity of the dopant atom are calculated, step 96.

A calibration step can be performed that requires applying a biasing voltage to the conductive electrode before measuring the nuclear spin transition frequencies. The biasing voltage allows modifying the electric field gradient experienced at the nucleus, which will in turn affect the quadrupole interaction, thereby changing the nuclear transition frequencies.

In order to calculate the values of strain the contribution to the electric field gradient due to the applied voltage has to be deconvoluted from the measurements of the nuclear transition frequencies.

This is achieved by comparing the nuclear spin transition frequencies at multiple bias voltages. The modified splittings between nuclear transition frequencies can be related to a change in electric field if the conversion matrix (the R tensor) is known. This matrix is specific to the dopant atom and host crystal, and can be determined from either simulations or from experiments.

Once the change in electric field is known, the electric-field contribution to the quadrupole interaction can be determined by comparing the experimental data to simulations of the electric field in the material near the dopant site. The remaining quadrupole interaction is then due to strain.

Once the electric-field contribution to the quadrupole interaction is subtracted, the remaining contribution is due to strain. The electric field gradient at the nucleus can be related to the strain at the nucleus via the conversion matrix (the S tensor). This matrix is specific to the dopant atom and the host crystal, and can be determined either from simulations or from experiments.

The quadrupole splitting provides some information about the full quadrupole interaction, and thus allows estimates of the strain at the dopant position.

The splittings between nuclear spin transition frequencies will depend on the orientation of the static magnetic field relative to the quadrupole interaction.

Measurements at different magnetic field orientations will therefore provide different splittings between the nuclear spin transition frequencies. These measured splittings can be used to numerically calculate the exact orientation of the quadrupole interaction. The full quadrupole tensor can be reduced to five independent parameters, and two distinct magnetic field orientations can be used to fully determine the quadrupole interaction.

The splittings between nuclear spin transition frequencies can be separated into first-order differences, and higher-order differences, each of which provides information about the quadrupole orientation.

A number of devices as described above with reference to FIG. 1 and FIG. 2 can be fabricated across different locations on, for example, a solid state quantum computing circuit. When the circuit is cooled to cryogenic temperatures, the devices can be operated to provide reading of strain values across the circuit. Information on crystal strain can be used in variety of ways, for example, to calibrate qubits in a quantum processor.

Importantly, when the devices are used in a classical electronic circuit, the strain values measured at low temperature can be used to gain an indication of strain at room temperature at the designated locations. Strain plays a major role in the operation of modern integrated circuits, therefore, being able to have a quantitative measurement of strain is a crucial advantage.

Throughout this specification, unless the context requires otherwise, the word "comprise", or variations such as "comprises" or "comprising", will be understood to imply the inclusion of a stated element, integer or step, or group of elements, integers or steps, but not the exclusion of any other element, integer or step, or group of elements, integers or steps.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of operating a quantum processing element comprising:
   a semiconductor and a dielectric material forming an interface with the semiconductor;
   a dopant atom with nuclear spin of quantum number larger than ½ embedded in the semiconductor at a distance from the interface,
   at least one conductive electrode disposed in a manner such that there is at least a portion of dielectric material between the at least one conductive electrode and the dopant atom;
the method comprising the steps of:
   applying a magnetic field to the dopant atom to separate energies of spin states associated with nucleus of the dopant atom;
   applying a voltage to the at least one conductive electrode to generate an electric field gradient at the nucleus of the dopant atom;
   encoding quantum information in the nuclear spin of the nucleus via the applied voltage, wherein the encoding is mediated by quadrupole interaction.

2. The method of claim 1, further comprising the step of controlling the voltage applied to the at least one conductive electrode to encode more than one bit of quantum information in the nuclear spin of the nucleus.

3. The method of claim 1, further comprising the steps of:
   applying a first electric signal to the at least one conductive electrode so that a static electric field gradient is generated at the nucleus of the dopant atom to modify the energy of the nuclear spin states; and
   applying a second electric signal to the at least one conductive electrode so that an oscillating electric field gradient is generated at the nucleus of the dopant atom to induce transitions between the quantum mechanical states of the nuclear spin.

4. The method of claim 3, wherein the voltage applied to the conductive electrode contributes to generating an electric field gradient at a donor atom.

5. The method of claim 1, further comprising the step of selecting a frequency of an oscillating electric field gradient to be equal to a spin transition frequency that causes the nuclear spin state to change by at least one quantum of angular momentum.

6. The method of claim 5, wherein the frequency of the oscillating electric field gradient is selected to be equal to a spin transition frequency that causes the nuclear spin state to change by two quanta of angular momentum.

7. The method of claim 5, wherein the frequency of the oscillating electric field gradient is selected on the basis of the combined effect of a static external magnetic field and/or the hyperfine coupling between a spin of the nucleus of the dopant atom and a charge bound to the dopant atom.

8. The method of claim 1, further comprising the step of applying an oscillating magnetic field at a frequency corresponding to the excitation of the electron or hole spin of the dopant atom when the nuclear spin is in a specific quantum state to determine the quantum state of the dopant nuclear spin.

9. The method of claim 1, further comprising the step of applying an oscillating electric field at a frequency corresponding to the excitation of the electron or hole spin of the dopant atom simultaneously to the de-excitation of the nuclear spin of the dopant atom by one quantum of angular momentum, to determine the quantum state of the dopant nuclear spin by observing the subsequent ionization of the dopant.

10. A quantum processing element comprising:
    a semiconductor and a dielectric material forming an interface with the semiconductor;
    a dopant atom with nuclear spin of quantum number larger than $\frac{1}{2}$ embedded in the semiconductor at a distance from the interface,
    at least one conductive electrode disposed in a manner such that there is at least a portion of dielectric material between the at least one conductive electrode and the dopant atom;
    wherein the at least one conductive electrode is arranged so that, by applying a voltage to the at least one conductive electrode, an electric field gradient is generated at a nucleus of the dopant atom and enables encoding of quantum information in the nuclear spin of the nucleus, and
    wherein the encoding is mediated by quadrupole interaction.

11. The element of claim 10, wherein the voltage is such that multiple quantum bits are encoded in the nuclear spin of the nucleus.

12. The element of claim 10, wherein the at least one conductive electrode is arranged in a manner such that the voltage applied to the electrode contributes to creating an electric field gradient at the dopant atoms that modifies the energy of the nuclear spin states.

13. The element of claim 10, wherein the at least one conductive electrode comprises:
    a first conductive electrode arranged to apply a static electric field across the dopant atom; and
    a second conductive electrode arranged to apply an oscillating electric field across the dopant atom.

14. The element of claim 13, wherein the at least one conductive electrode may comprise further one or more electrodes arranged to control or readout information from the processing element.

15. A method of sensing strain in a crystalline semiconductor material using the element according to claim 11, the method comprising:
    applying a static magnetic field to the dopant atom to separate the energies of the spin states associated with the nucleus of the dopant atom;
    measuring nuclear spin transition frequencies of the dopant atom;
    calculating one or more values of lattice strain of the semiconductor crystal in proximity of the dopant atom by analysing the nuclear spin transition frequencies.

16. The method of claim 15, wherein the step of applying a biasing voltage to the at least one conductive electrode is performed before measuring the nuclear spin transitions, and wherein the step of applying a biasing voltage is performed more than one time with different biasing voltages.

17. The method of claim 15, wherein the step of calculating one or more values of lattice strain of the semiconductor crystal comprises calculating one or more electric field gradient values at the nucleus.

18. The method of claim 16, wherein the step of calculating one or more values of lattice strain of the semiconductor crystal comprises comparing one or more values of the electric field gradient with respective values of the gradient elastic tensor of the semiconductor material.

19. The method of claim 15, comprising applying the static magnetic field to the dopant atom along a number of different directions and measuring nuclear spin transition frequencies of the dopant atom for each applied magnetic field direction.

20. The method of claim 17, where the step of calculating one or more electric field gradient values at the nucleus comprises deconvoluting a portion of electric field gradient due to the applied biasing voltage from the portion of electric field gradient due to the lattice strain.

* * * * *